United States Patent
Tanida et al.

(10) Patent No.: US 7,638,421 B2
(45) Date of Patent: Dec. 29, 2009

(54) MANUFACTURING METHOD FOR SEMICONDUCTOR DEVICE AND SEMICONDUCTOR DEVICE

(75) Inventors: Kazumasa Tanida, Miyagi (JP); Yoshihiko Nemoto, Tokyo (JP); Mitsuo Umemoto, Osaka (JP)

(73) Assignees: Rohm Co., Ltd., Kyoto (JP); Renesas Technology Corp., Tokyo (JP); Sanyo Electric Co., Ltd., Osaka (JP)

( * ) Notice: Subject to any disclaimer, the term of this patent is extended or adjusted under 35 U.S.C. 154(b) by 358 days.

(21) Appl. No.: 11/717,010

(22) Filed: Mar. 13, 2007

(65) Prior Publication Data

US 2007/0155155 A1    Jul. 5, 2007

Related U.S. Application Data

(62) Division of application No. 10/954,649, filed on Oct. 1, 2004, now Pat. No. 7,227,262.

(30) Foreign Application Priority Data

Oct. 3, 2003 (JP) .............................. 2003-345928

(51) Int. Cl.
    *H01L 21/44* (2006.01)
(52) U.S. Cl. ............... 438/614; 257/E21.508; 438/613
(58) Field of Classification Search .......... 438/613, 438/614; 257/E21.508
    See application file for complete search history.

(56) References Cited

U.S. PATENT DOCUMENTS

| 5,631,499 | A  | 5/1997  | Hosomi et al. |
| 6,028,011 | A  | 2/2000  | Takase et al. |
| 6,372,622 | B1 | 4/2002  | Tan et al. |
| 6,413,851 | B1 | 7/2002  | Chow et al. |
| 6,426,281 | B1 | 7/2002  | Lin et al. |
| 6,489,229 | B1 | 12/2002 | Sheridan et al. |
| 6,756,294 | B1 | 6/2004  | Chen et al. |
| 2002/0056901 | A1 | 5/2002 | Ono et al. |
| 2003/0096494 | A1 | 5/2003 | Sakuyama et al. |

FOREIGN PATENT DOCUMENTS

JP        2-207531       8/1990

(Continued)

*Primary Examiner*—Asok K Sarkar
(74) *Attorney, Agent, or Firm*—Rabin & Berdo, PC

(57) ABSTRACT

A manufacturing method for a semiconductor device, including the steps of: forming a passivation film that covers a surface of a semiconductor substrate on which electrodes have been formed, in which an opening is formed so as to expose a predetermined electrode from among the electrodes; forming a diffusion prevention plug of a first metal in the vicinity of the opening in the passivation film; supplying a second metal material to the surface of the semiconductor substrate on which the diffusion prevention plug has been formed, so as to form a seed layer of the second metal; forming a resist film that covers the seed layer and in which an opening is formed so as to expose a predetermined region of the seed layer on the diffusion prevention plug; supplying a third metal material into the opening in the resist film so as to form a protrusion electrode of the third metal; removing the resist film after the step of forming a protrusion electrode; and removing the seed layer after the step of forming a protrusion electrode.

9 Claims, 7 Drawing Sheets

FOREIGN PATENT DOCUMENTS

| | | |
|---|---|---|
| JP | 03-248528 | 11/1991 |
| JP | 4-199631 | 7/1992 |
| JP | 7-297149 | 11/1995 |
| JP | 11-214421 | 8/1999 |
| JP | 2000-164623 | 6/2000 |
| JP | 2000-357702 | 12/2000 |
| JP | 2003-218152 | 7/2003 |

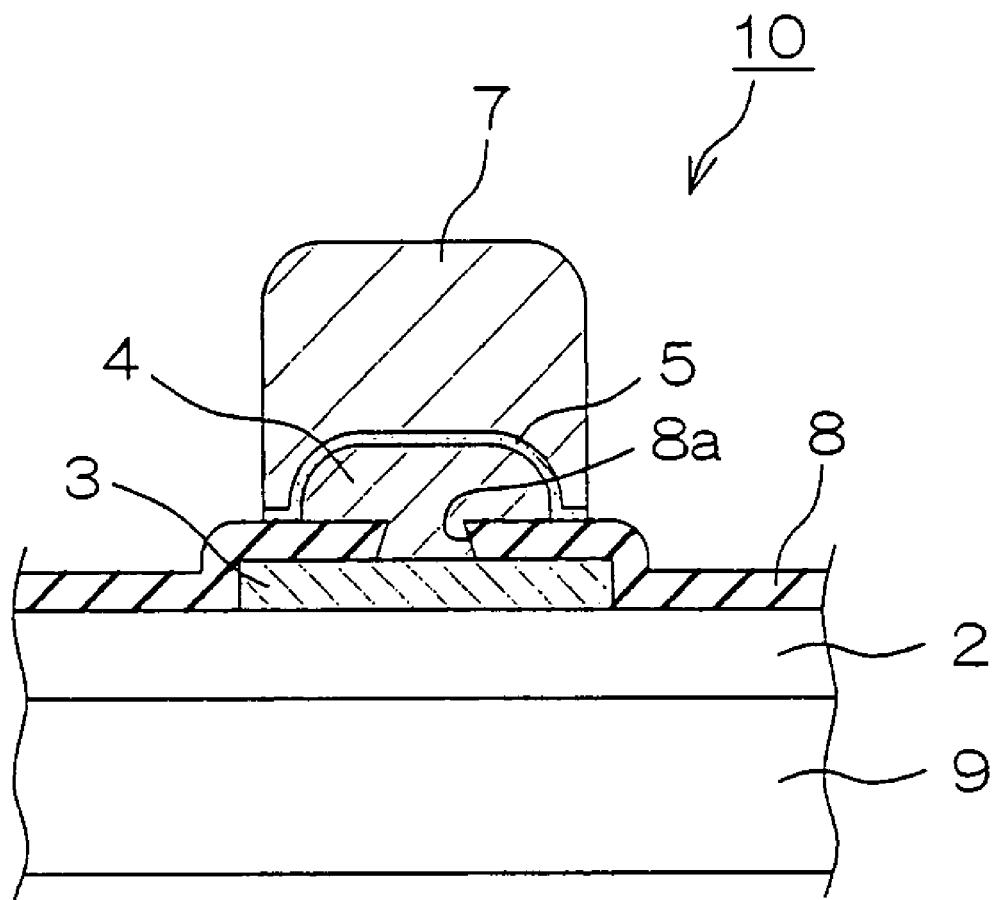

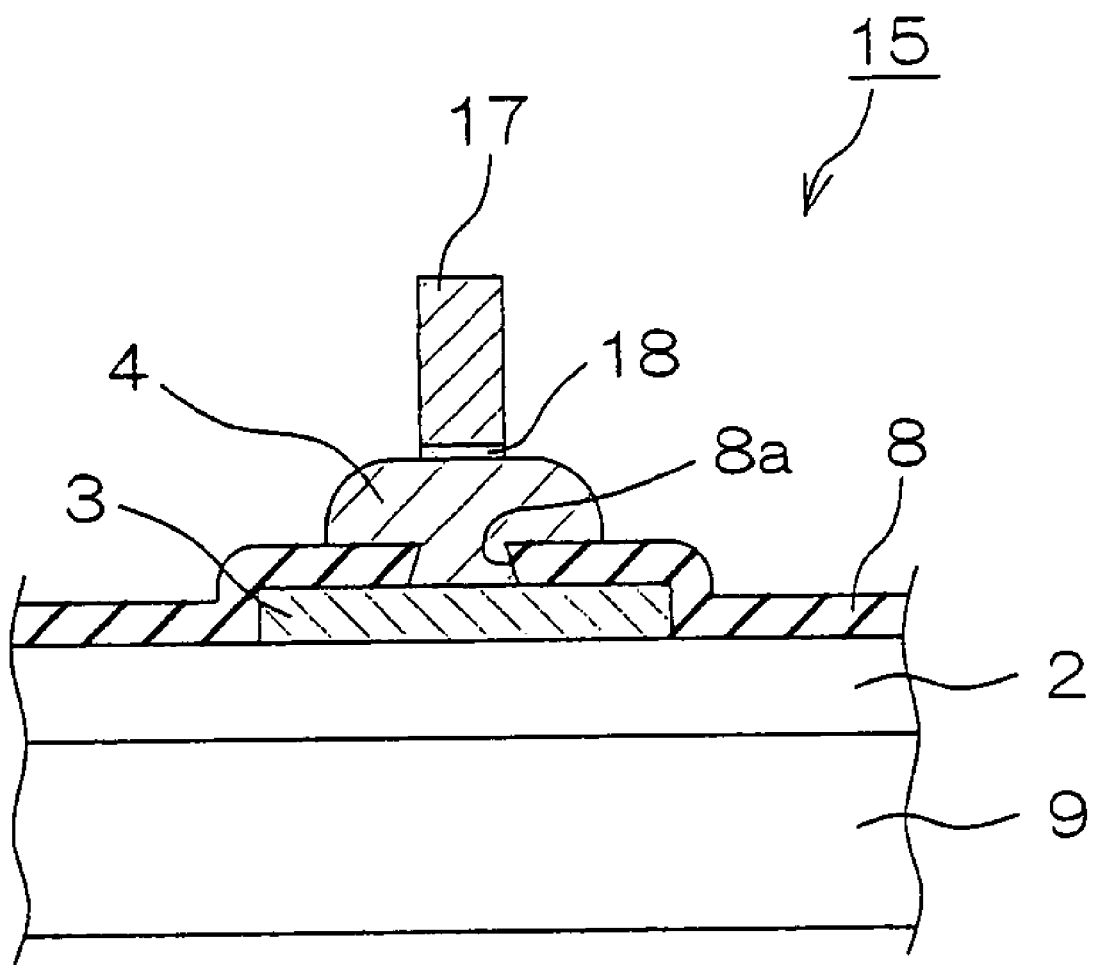

MANUFACTURING METHOD FOR SEMICONDUCTOR DEVICE AND SEMICONDUCTOR DEVICE

This is a Divisional of U.S. application Ser. No. 10/954,649, filed Oct. 1, 2004 now U.S. Pat. No. 7,227,262, the subject matter of which is incorporated herein by reference.

BACKGROUND OF THE INVENTION

1. Field of the Invention

The present invention relates to a manufacturing method for a semiconductor device and a semiconductor device and, in particular, to a manufacturing method for a semiconductor device having protrusion electrodes which are aligned on a semiconductor substrate at narrow intervals, and a semiconductor device that is obtained according to this manufacturing method.

2. Description of Related Art

According to a mounting technology for a semiconductor device, there is a so-called flip chip connection where a semiconductor chip is directly connected to another wiring substrate without being packaged. Protrusion electrodes are formed on a semiconductor chip for flip chip connection so that the semiconductor chip can be joined to electrode pads or the like formed on a wiring substrate via the protrusion electrodes.

FIG. 5 is a cross-sectional view illustrating a conventional semiconductor device on which a protrusion electrode is formed.

This semiconductor device has a semiconductor substrate 109 which is not packaged, thus making a so-called flip chip connection possible. An active layer 102 that includes a function element (device) and a wire is formed on one surface of semiconductor substrate 109. An electrode pad and a wire (hereinafter, these are collectively referred to as "electrode pad") 103 which are electrically connected to the function element in active layer 102 are formed in a predetermined position on active layer 102. Electrode pad 103 is made of metal.

A passivation film 108 for protecting active layer 102 is formed on active layer 102. An opening 108a is formed in passivation film 108 so as to expose electrode pad 103.

A protrusion electrode 107 is formed on electrode pad 103 that is exposed through opening 108a in passivation film 108, with a barrier metal layer (UBM: Under Bump Metal) 104 and a seed layer 105 interposed therebetween. Electrode pad 103 and active layer 102 are protected by barrier metal layer 104.

This semiconductor device makes a flip chip connection possible by joining protrusion electrode 107 to an electrode pad formed on a wiring substrate or another semiconductor device. As a result of this, the function element in active layer 102 can be externally connected.

FIG. 6(a) to FIG. 6(c) are cross-sectional views illustrating a manufacturing method for the semiconductor device shown in FIG. 5.

An active layer 102 that includes a function element and a wire is formed on one surface, which has been flattened in advance, of a semiconductor substrate 101 (for example, a semiconductor wafer) where regions corresponding to a plurality of semiconductor substrates 109 are densely formed, and an electrode pad 103 for electrically connecting the function element or the like in active layer 102 to the outside is formed in a predetermined position on active layer 102.

Next, a passivation film 108 is formed on semiconductor substrate 101, and an opening 108a is formed in this passivation film 108 so as to expose electrode pad 103. Then, a barrier metal layer 104 is formed on the entirety of the surface of semiconductor substrate 101, which has undergone the above described process, on the active layer 102 side. Then, a seed layer 105 is formed on the entirety of the surface of barrier metal layer 104. FIG. 6(a) shows this state.

Furthermore, a resist film (photo resist) 106 having an opening 106a in a portion corresponding to electrode pad 103 is formed on seed layer 105 (see FIG. 6(b)). Opening 108a is positioned within opening 106a as seen in the plan view where semiconductor substrate 101 is vertically viewed from the top. Opening 106a has an inner side walls approximately vertical to semiconductor substrate 101.

After that, a protrusion electrode 107 is formed within opening 106a in resist film 106 by means of electrolysis plating. At this time, a current flows to the plating solution via barrier metal layer 104 and seed layer 105, which becomes the starting point of the plating growth when electrolysis plating is carried out. As a result of this, a metal such as copper is coated on seed layer 105, thus forming protrusion electrode 107.

The formation of protrusion electrode 107 is completed before the thickness (height from seed layer 105) of protrusion electrode 107 exceeds the thickness of resist layer 106. As a result of this, a state is reached where protrusion electrode 107 exists only within opening 106a. FIG. 6(c) shows this state.

Subsequently, resist film 106 is removed, and furthermore, seed layer 105 is removed by means of dry etching, except for the portion that exists between barrier metal layer 104 and protrusion electrode 107. Then, barrier metal layer 104 is removed by means of wet etching, except for the portion that exists between electrode pad 103 and seed layer 105, as well as between passivation film 108 and seed layer 105. As a result of this, protrusion electrode 107 that protrudes from semiconductor substrate 101 (passivation film 108) is obtained.

After that, semiconductor substrate 101 is cut into pieces of a semiconductor substrate 109, thus obtaining a semiconductor device having protrusion electrode 107, as shown in FIG. 5. Such a manufacturing method for a semiconductor device is disclosed in, for example, "Chisso's Wafer Bumping Service" by Yoshiaki Yamamoto, Densi Zairyo (*Electronic Material*), May 1995, p. 101-104.

At the time when barrier metal layer 104 is removed by means of wet etching, however, it is difficult to control the amount of etching, and sometimes barrier metal layer 104 between protrusion electrode 107 and electrode pad 103 as well as between electrode 107 and passivation film 108 is also removed (over-etched). The amount of this over-etching, that is, the amount of etching in the direction inwardly from the edge portion of protrusion electrode 107 is, for example, approximately 2 μm as seen in the plan view where semiconductor substrate 101 is vertically viewed from the top. In this case, the strength of the connection between protrusion electrode 107 and electrode pad 103 is reduced.

In addition, in the case where over-etching of barrier metal layer 104 progresses excessively to the extent where barrier metal layer 104 that exists between electrode pad 103 and protrusion electrode 107 is also etched, an exposed (uncoated) region occurs in electrode pad 103. This leads to reduction in the reliability of the device due to corrosion or the like of electrode pad 103.

In order to avoid the above described problems, the size of protrusion electrode 107 in the directions along semiconductor substrate 101 (hereinafter referred to as "width of protrusion electrode 10") must be greater than the width of the portion of electrode pad 103 that is exposed through passivation film 108 (width of opening 108a) by at least 2 μm on each side.

Furthermore, taking into consideration an exposure shift in the case where opening 106a in resist film 106 is formed by means of exposure to light and developing, and dispersion in the width of protrusion electrode 107 that is formed by means of electrolysis plating, it is necessary for the width of protrusion electrode 107 to be greater than the portion of electrode pad 103 that is exposed through passivation film 108 by approximately 5 μm on each side. That is, even in the case where the width of the portion of electrode pad 103 that is exposed through passivation film 108 is set at 1 μm, the width of protrusion electrode 107 becomes approximately 11 μm. Namely, the reduction in the size of protrusion electrode 107 or miniaturization of protrusion electrode 107, and the reduction in the intervals of the protrusion electrodes 107, cannot be achieved.

In addition, though it is preferable for the inner wall surface of opening 108a in passivation film 108 to be straight (vertical to semiconductor substrate 101) or to be in a taper form that expands laterally in the upward direction, in some cases, the inner wall surface becomes a reverse taper form (taper form that expands laterally in the downward direction (from the semiconductor substrate 101 side)).

In this case, in the case where barrier metal layer 104 that becomes a base for plating (of seed layer 105) is formed by means of anisotropic sputtering or the like, the portion in the vicinity of the inner wall surface of opening 108a in reverse taper form cannot be coated with barrier metal layer 104, resulting in an exposed region (not coated with barrier metal layer 104) in electrode pad 103. In this case, metal diffusion occurs between electrode pad 103 and protrusion electrode 107, thus reducing the reliability.

Furthermore, a step is formed in barrier metal layer 104 that becomes a base for plating, and in seed layer 105 due to opening 108a in passivation film 108. As a result of this, the end surface (top surface) of protrusion electrode 107 has a form with a recess in the center portion reflecting this step, as shown in FIG. 5. When a semiconductor device where such a protrusion electrode 107 is formed is joined to electrode pads or the like formed on a wiring substrate, protrusion electrode 107 cannot be connected well to the electrode pad of the wiring substrate, causing a mechanical defect or an electrical defect in the connection.

SUMMARY OF THE INVENTION

An object of this invention is to provide a manufacturing method for a semiconductor device with protrusion electrodes, wherein miniaturization of these protrusion electrodes and reduction in the intervals of the protrusion electrodes are possible.

Another object of this invention is to provide a manufacturing method for a semiconductor device with a protrusion electrode, wherein the end surface of the protrusion electrode can be made substantially flat or in a convex form.

Still another object of this invention is to provide a manufacturing method for a semiconductor device with an electrode pad, wherein the electrode pad can be substantially completely covered.

Yet another object of this invention is to provide a semiconductor device with protrusion electrodes, wherein miniaturization of these protrusion electrodes and reduction in the intervals of the protrusion electrodes are possible.

Still yet another object of this invention is to provide a semiconductor device with a protrusion electrode, wherein the end surface of the protrusion electrode can be made substantially flat or in a convex form.

Still another object of this invention is to provide a semiconductor device with an electrode pad, wherein the electrode pad can be substantially completely covered.

A manufacturing method for a semiconductor device according to this invention includes the steps of: forming a passivation film that covers a surface of a semiconductor substrate on which electrodes have been formed, in which an opening is formed so as to expose a predetermined electrode from among the electrodes; forming a diffusion prevention plug made of a first metal in the vicinity of the opening in the passivation film; supplying a second metal material to the surface of the semiconductor substrate on which the diffusion prevention plug has been formed, so as to form a seed layer made of the second metal; forming a resist film that covers the seed layer and in which an opening is formed so as to expose a predetermined region of the seed layer on the diffusion prevention plug; supplying a third metal material into the opening in the resist film so as to form a protrusion electrode made of the third metal; removing the resist film after this step of forming the protrusion electrode; and removing the seed layer after the step of forming the protrusion electrode.

According to this invention, the diffusion prevention plug is formed only in the vicinity of the opening in the passivation film. That is, the diffusion prevention plug is not formed on the entirety of the surface of the semiconductor substrate, unlike a barrier metal layer that is formed according to a conventional manufacturing method. As a result of this, it is not necessary to remove a portion of the diffusion prevention plug after the step of removing the seed layer that is carried out after the formation of the protrusion electrode.

In addition, in the case where a portion of the diffusion prevention plug is not removed after the formation of the diffusion prevention plug, the form of the diffusion prevention plug after the formation of the protrusion electrode is almost the same as its initial form. Therefore, in the case where the diffusion prevention plug is formed so as to almost completely coat the portion of the electrode pad that has been exposed through the passivation film, for example, the form of the diffusion prevention plug barely changes in the subsequent steps, and the state is maintained where this portion of the electrode pad that has been exposed is almost completely covered with the diffusion prevention plug. That is, the state does not occur, unlike in a conventional manufacturing method, wherein the barrier metal layer is over-etched and an electrode pad is exposed.

Therefore, there liability is not reduced due to a reduction in the strength of the connection between the protrusion electrode and the electrode pad, or due to the exposure of the electrode pad.

Because of the above described reasons, it is not necessary to increase the width of the protrusion electrode taking the margin of over-etching into consideration, unlike in a conventional manufacturing method. That is, the invention allows the reduction in the width of the diffusion prevention plug and of the protrusion electrode, so that miniaturization of the protrusion electrode and reduction in the intervals of the protrusion electrodes can be achieved. According to this manufacturing method for a semiconductor device, protrusion electrodes having a width of 6 μm and aligned at intervals of 10 μm, for example, can be formed.

The step of forming a seed layer may include the step of forming a seed layer on the entirety of the surface of the semiconductor substrate on which the diffusion prevention plug has been formed. In this case, when two or more diffusion prevention plugs are formed, these diffusion prevention plugs may be electrically short-circuited through the seed layer. However, the seed layer that exists among those diffusion prevention plugs can be removed in the step of removing the seed layer, so that the diffusion prevention plugs can be electrically separated from each other.

The step of forming the diffusion prevention plug may include the step of forming the diffusion prevention plug in a manner where the opening in the passivation film is substantially completely filled. In this case, the seed layer and the protrusion electrode can be formed after the step (the difference in level) resulting from the opening in the passivation film has been nullified, and therefore, the end surface of the protrusion electrode can be made substantially flat or in a convex form (a recess can be prevented from occurring in the end surface of the protrusion electrode). In this case, at the time when this semiconductor device is joined to electrode pad or the like formed on a wiring substrate, the protrusion electrode can be mechanically joined to the electrode pad or the like on the wiring substrate in a good manner, making a good electrical connection.

The above described step of removing the seed layer may include an etching step of removing the seed layer by means of etching. In this case, the diffusion prevention plug may be formed of the first metal material of which the etching rate is lower than that of the seed layer for an appropriate etching medium used in the etching step.

In this arrangement, the diffusion prevention plug can be mostly prevented from being etched, even in the case where the seed layer is etched and the diffusion prevention plug is exposed to the etching medium for etching the seed layer.

In the case where the seed layer is made of gold (Au), for example, the diffusion prevention plug may be made of nickel (Ni). An appropriate etching medium (for example, etchant) can be selected, and thereby, the seed layer made of gold can be easily etched by this etching medium, while mostly preventing the diffusion prevention plug made of nickel from being etched.

The step of forming the diffusion prevention plug may include the step of supplying the first metal material onto the predetermined electrode on the semiconductor substrate by means of an electroless plating method so as to form a diffusion prevention plug made of the first metal.

In this arrangement, appropriate plating conditions are selected so that the diffusion prevention plug can grow from the portion of the electrode pad exposed through the passivation film. Therefore, even in the case where the step resulting from the passivation film (the inner wall surface of the opening in the passivation film) is in reversed taper form, the exposed portion of the electrode pad can be substantially completely covered with the diffusion prevention plug.

In addition, the opening in the passivation film can be substantially completely filled with the diffusion prevention plug by forming the diffusion prevention plug by means of an electroless plating method. As a result of this, the step resulting from the opening of the passivation film is nullified as described above, so that the end surface of the protrusion electrode can be made substantially flat or in a convex form, while preventing the electrode pad from being exposed, and thereby, the reliability can be increased.

The seed layer may be formed of the same metal material as the protrusion electrode. In this arrangement, the seed layer and the protrusion electrode are etched at the same etching rate in the step of removing the seed layer, and therefore, the seed layer between the protrusion electrode and the passivation film or the diffusion prevention plug is not over-etched.

The above described resist film may be made of a material having photosensitivity, and in this case, the step of forming the resist film may include the step of forming the opening by developing after exposing the resist film via a mask having a predetermined pattern.

In this arrangement, a microscopic opening can be easily formed in the resist film, and therefore, a microscopic protrusion electrode (with a narrow width) can be formed by supplying a metal material into such an opening in the step of forming a protrusion electrode.

The step of forming the protrusion electrode may include the step of supplying the third metal material to the predetermined region of the seed layer by means of an electrolysis plating method.

In this arrangement, the third metal material is supplied only into the opening formed in the predetermined position in the resist film. As a result of this, the third metal material can be supplied only to the necessary region, and therefore, costs can be reduced in the case where the third metal material includes an expensive material such as, for example, gold.

The step of removing the seed layer may include the step of removing the portion of the seed layer that is exposed from the protrusion electrode by means of a dry type anisotropic etching method.

When the seed layer is removed by means of a dry type anisotropic etching method, only the upper surface of the protrusion electrode is selectively etched. Accordingly, in this arrangement, the width of the protrusion electrode barely changes, as a result of the step of removing the seed layer. That is, a protrusion electrode having a small width can be easily formed according to this manufacturing method.

In addition, the step of removing the seed layer may include the step of removing the portion of the seed layer that is exposed from the protrusion electrode, by means of a wet etching method.

In this arrangement, the seed layer can be removed by means of wet etching, thus increasing the productivity.

The width of the opening in the resist film may be greater than the width of the diffusion prevention plug.

In this arrangement, the state can be reached where the diffusion prevention plug is completely covered with the protrusion electrode via the seed layer. Therefore, the diffusion prevention plug is not easily exposed in the step of removing the seed layer or the like, and therefore, a semiconductor device having high reliability, where the electrode pad is substantially completely covered with the diffusion prevention plug, can be manufactured.

An appropriate method (arrangement) can be selected from among the above described methods (arrangements) in accordance with the types of materials selected for the protrusion electrode, the seed layer and the diffusion prevention plug.

A semiconductor device according to this invention includes: a semiconductor substrate; electrodes formed on the semiconductor substrate; a passivation film which covers the surface of the semiconductor substrate on which the electrodes are formed, and in which an opening is formed so as to expose a predetermined electrode from among the electrodes; a diffusion prevention plug which is formed in the vicinity of the opening of the passivation film so as to be electrically connected to the electrode; a seed layer formed on the diffusion prevention plug; and a protrusion electrode formed on the seed layer. As seen in the plan view where the semiconductor substrate is viewed vertically from the top, the region where the seed layer and the protrusion electrode are formed substantially completely includes the region where the diffusion prevention plug is formed, and the diffusion prevention plug is substantially completely covered with the seed layer and the protrusion electrode.

The above described and other objects, features and effects in the present invention are clarified in the descriptions of the embodiments in the following, in reference to the attached drawings.

BRIEF DESCRIPTION OF THE DRAWINGS

FIG. 1 is a cross-sectional view illustrating a semiconductor device according to the first embodiment of the present invention;

FIG. 3 is a cross-sectional view illustrating a semiconductor device that is obtained in accordance with a manufacturing method according to the second embodiment of the present invention;

DESCRIPTION OF THE PREFERRED EMBODIMENTS

Figure 2A:
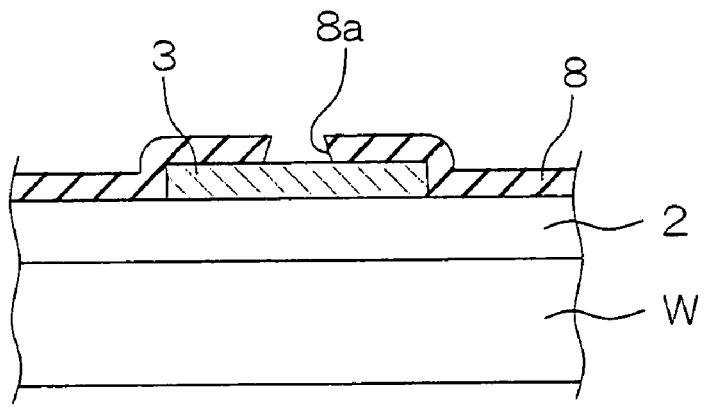
FIG. 2(a) to FIG. 2(f) are cross-sectional views for explaining a manufacturing method for the semiconductor device shown in FIG. 1.
Figure 2B:
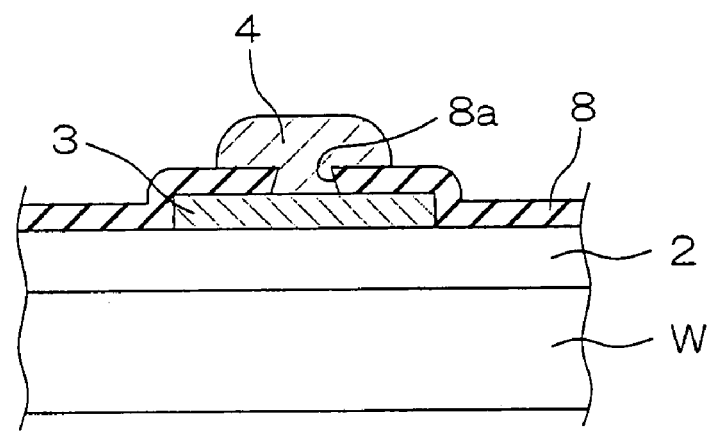

FIG. 1 is a cross-sectional view illustrating a semiconductor device that is obtained in accordance with a manufacturing method according to the first embodiment of the present invention.

This semiconductor device 10 has a semiconductor substrate 9 which is not packaged, thus making a so-called flip chip connection possible. An active layer 2 that includes a function element (device) and a wire is formed on one surface of the semiconductor substrate 9.

A plurality of electrode pads and wires (hereinafter collectively referred to as "electrode pad") 3 are formed in predetermined positions on active layer 2, and are formed of, for example, aluminum (Al), copper (Cu), an alloy of aluminum and copper, or gold (Au), so as to be electrically connected to the function element in active layer 2 (FIG. 1 shows only one electrode pad 3). Miniaturization of each electrode pad has been achieved, so that the width of electrode pad 3 is, for example, 6 μm or less. In addition, electrode pads 3 are aligned in a manner where the intervals of electrode pads 3 are reduced (the intervals are, for example, 10 μm).

A passivation film 8 is formed on active layer 2 so as to protect active layer 2. An opening 8a is formed in passivation film 8 so as to expose electrode pad 3.

A diffusion prevention plug 4 made of a metal is formed so as to substantially completely cover electrode pad 3 that is exposed through opening 8a in passivation film 8. Diffusion prevention plug 4 protrudes from the surface of passivation film 8, and is formed in a region which substantially completely includes opening 8a as seen in the plan view where semiconductor substrate 9 is viewed vertically from the top. Diffusion prevention plug 4 can be made of a material that is different from that of electrode pad 3.

A seed layer 5 is formed on diffusion prevention plug 4, and a protrusion electrode 7 made of the same metal material as that of seed layer 5 is formed on and protrudes from seed layer 5. The side surface of the protrusion electrode 7 is approximately perpendicular to semiconductor substrate 9, and are approximately on the same plane as the end surfaces of seed layer 5. Seed layer 5 and protrusion electrode 7 can be made of a material that is different from that of diffusion prevention plug 4.

Diffusion prevention plug 4 is formed by means of electroless plating, while protrusion electrode 7 is formed by means of electrolysis plating. That is, this semiconductor device 10 is provided with protrusion electrode 7 that is formed by means of electrolysis plating on top of diffusion prevention plug 4 formed by means of electroless plating.

Protrusion electrode 7 is formed in a region that substantially completely includes the region where diffusion prevention plug 4 is formed, as seen in the plan view where semiconductor substrate 9 is viewed vertically from the top. The end surface of protrusion electrode 7 is a substantially flat surface.

This semiconductor device 10 makes a flip chip connection possible by joining protrusion electrode 7 to an electrode pad or the like formed on a wiring substrate or on another semiconductor device. As a result of this, the function element in active layer 2 can be externally connected via electrode pad 3, diffusion prevention plug 4, seed layer 5 and protrusion electrode 7.

Electrode pad 3 is substantially completely covered with diffusion prevention plug 4, and thereby, the strength of the connection between protrusion electrode 7 and electrode pad 3 via diffusion prevention plug 4 is increased without a reduction in reliability due to the exposure of electrode pad 3.

Figure 5:
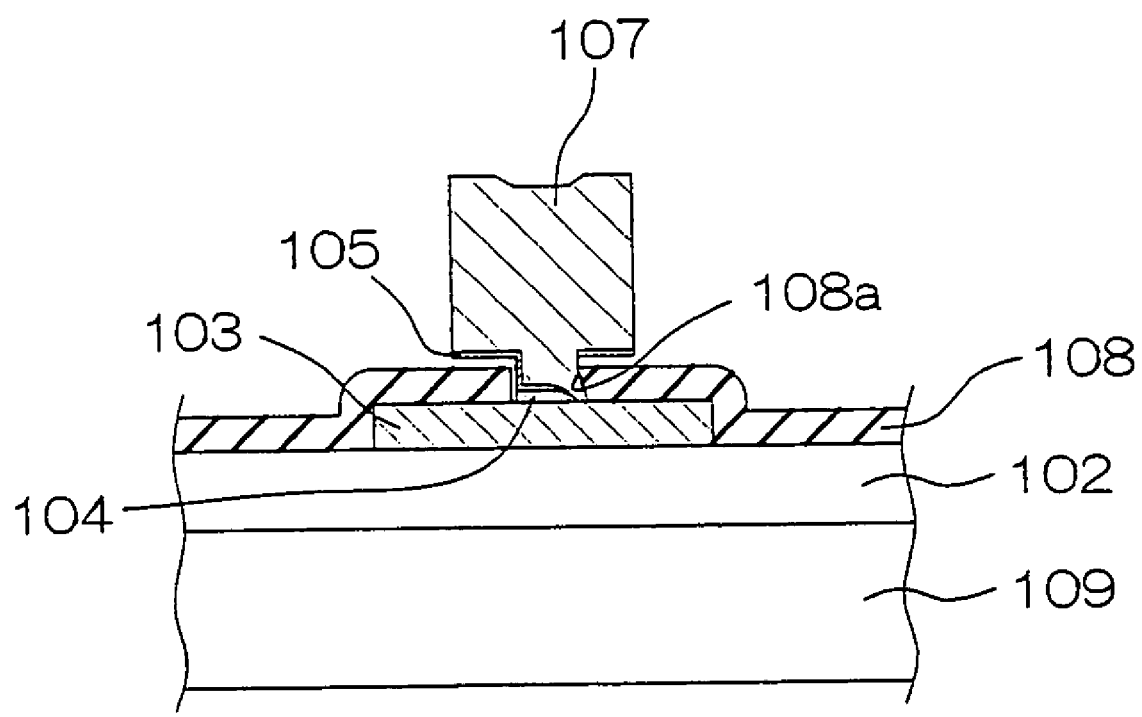
FIG. 5 is a cross-sectional view illustrating a conventional semiconductor device where a protrusion electrode is formed.

Diffusion prevention plug 4 can be made of a metal material that does not allow the occurrence of diffusion between the metal forming electrode pad 3 and the metal forming protrusion electrode 7, in the same manner as barrier metal layer 104 of the conventional semiconductor device (see FIG. 5). As a result of this, the reliability of semiconductor device 10 can be increased.

The end surface of protrusion electrode 7 is a substantially flat surface, and thereby, protrusion electrode 7 can be mechanically and electrically connected (joined) to an electrode pad or the like in a good manner at the time when semiconductor device 10 is joined to electrode pads formed on a wiring substrate or the like.

FIG. 2(a) to FIG. 2(f) are cross-sectional views for explaining a manufacturing method for semiconductor device 10 shown in FIG. 1.

First, an active layer 2 that includes a function element and a wire is formed on one surface, which has been flattened in advance, of a semiconductor wafer (hereinafter simply referred to as "wafer") W, which is an example of a semiconductor substrate, and then, an electrode pad 3 is formed in a predetermined position on active layer 2. After that, a passivation film 8 is formed, in which an opening 8a is formed so as to expose electrode pad 3. Opening 8a is formed so as to expose, for example, only the center portion of electrode pad 3. FIG. 2(a) shows this state.

Subsequently, electroless plating is carried out on the surface on which passivation film 8 has been formed, of wafer W that has undergone the above described process. At this time, an appropriate plating solution and plating conditions are selected, and thereby, a film resulting from the plating grows on electrode pad 3 exposed within opening 8a, and does not grow directly, on passivation film 8.

In this case, the film resulting from the plating grows so as to fill opening 8a starting from the space closer to electrode pad 3, and when opening 8a is completely filled, the film resulting from the plating grows so as to expand to a region wider than opening 8a, as seen in the plan view where wafer W is viewed vertically from the top. As a result of this, a diffusion prevention plug 4 made of a metal is formed.

Even in the case where the inner wall surfaces of opening 8a are in reverse taper form that spread laterally in the direction toward the wafer W side as shown in FIG. 2(*a*), diffusion prevention plug 4 is formed by means of electroless plating so as to substantially completely coat electrode pad 3. The width of diffusion prevention plug 4 becomes greater than the width of opening 8a on the outside of opening 8a. The end surface of diffusion prevention plug 4 becomes an substantially flat surface. FIG. 2(*b*) shows this state.

Diffusion prevention plug 4 is made of a material that barely allows diffusion with electrode pad 3, seed layer 5 and protrusion electrode 7, and, for example, in the case where electrode pad 3 is made of aluminum (Al), while seed layer 5 and protrusion electrode 7 are made of gold (Au), diffusion prevention plug 4 can be made of nickel (Ni).

Next, a seed layer 5 having electrical conductivity is formed by means of a method such as sputtering or chemical deposition on the surface of wafer W, on which passivation film 8 and diffusion prevention plug 4 have been formed (see FIG. 2(*c*)). The surface of seed layer 5 is shaped in accordance with that of the surface of passivation film 8 and diffusion prevention plug 4, which are the base of the seed layer 5. Opening 8a in passivation film 8 is filled with diffusion prevention plug 4, and thereby, the step of passivation film 8 resulting from opening 8a is not reflected in the form of the surface of seed layer 5, but rather, the surface of seed layer 5 on the end surface of diffusion prevention plug 4 becomes substantially flat.

Subsequently, a resist film (photoresist) 6 is formed on the entirety of the surface of seed layer 5. The thickness of resist film 6 is made greater than the thickness (height) of diffusion prevention plug 4. After that, the portion of resist film 6 above diffusion prevention plug 4 is removed by means of photolithography so as to form an opening 6a in resist film 6. According to this method, a microscopic opening 6a can be easily created in resist film 6.

The width of opening 6a in resist film 6 is made to be greater than the width of diffusion prevention plug 4, and opening 6a in resist film 6 is formed in a region that substantially completely includes the region where diffusion prevention plug 4 is formed, as seen in the plan view where wafer W is viewed vertically from the top (see FIG. 2(*d*)).

After that, protrusion electrode 7 made of, for example, gold (Au), is formed by means of electrolysis plating on seed layer 5 that has been exposed within opening 6a in resist film 6 and that serves as a seed for the plating. At this time, a current flows between the plating solution and the exposed portion of seed layer 5, and thereby, metal atoms are deposited on seed layer 5 so that protrusion electrode 7 grows. That is, opening 6a in resist film 6 is filled with protrusion electrode 7 that grows on seed layer 5.

At this time, the form of the top surface (end surface) of protrusion electrode 7 becomes approximately flat or of a convex form, reflecting the form of the top surface of diffusion prevention plug 4. That is, the top surface of protrusion electrode 7 does not become of a form that has a recess in the center portion, unlike the end surface of protrusion electrode 107 according to a conventional manufacturing method (see FIG. 6(*c*)). The formation of protrusion electrode 7 is completed before opening 6a in resist film 6 is completely filled.

As a result of this, as shown in FIG. 2(*e*), the state is reached where protrusion electrode 7 exists only within opening 6a in resist film 6. Protrusion electrode 7 is formed in a region that substantially completely includes the region where diffusion prevention plug 4 has been formed, as seen in the plan view where wafer W is viewed vertically from the top, and adjacent diffusion prevention plugs 4 are not electrically connected.

The metal material for forming protrusion electrode 7 is supplied only into opening 6a in resist film 6 as a result of the electrolysis plating, and thereby, the cost can be reduced in the case where protrusion electrode 7 is made of an expensive material such as gold.

Next, resist film 6 is removed, and the state is reached where protrusion electrode 7 protrudes from seed layer 5 (see FIG. 2(*f*)).

Subsequently, the portion of seed layer 5 which is not covered by protrusion electrode 7, and thus is exposed, on passivation film 8 is removed by means of wet etching so as to reach the state where seed layer 5 and protrusion electrode 7 protrude from passivation film 8 and from diffusion prevention plug 4.

Since protrusion electrode 7 and seed layer 5 are made of the same metal material (for example, gold), protrusion electrode 7 and seed layer 5 are etched at the same etching rate when seed layer 5 is removed by means of etching. Therefore, seed layer 5 between protrusion electrode 7 and passivation film 8 as well as between protrusion electrode 7 and diffusion prevention plug 4 is prevented from being over-etched.

Diffusion prevention plug 4 can be made of a metal material of which the etching rate is lower than that of seed layer 5 when etched by an etchant that is used for the removal of seed layer 5. In the case where seed layer 5 is made of gold and diffusion prevention plug 4 is made of nickel, for example, an appropriate etchant can be selected so that seed layer 5 is easily etched by this etchant, while diffusion prevention plug 4 is mostly prevented from being etched.

In this case, even when protrusion electrode 7 is etched together with seed layer 5 and diffusion prevention plug 4 is exposed to the etchant, diffusion prevention plug 4 is barely etched, preventing electrode pad 3 from being exposed.

In addition, seed layer 5 is removed by means of wet etching, and thereby, productivity can be increased.

The step of removing seed layer 5 may be carried out by means of dry type anisotropic etching. In this case, only the top surface (end surface) of protrusion electrode 7 is selectively etched at the time of removal of seed layer 5. Accordingly, the width of protrusion electrode 7 barely changes. Therefore, protrusion electrode 7 having a small width can be easily formed.

After that, wafer W is cut into pieces of a semiconductor substrate 9 so that a semiconductor device 10 shown in FIG. 1 is obtained.

Figure 6A:
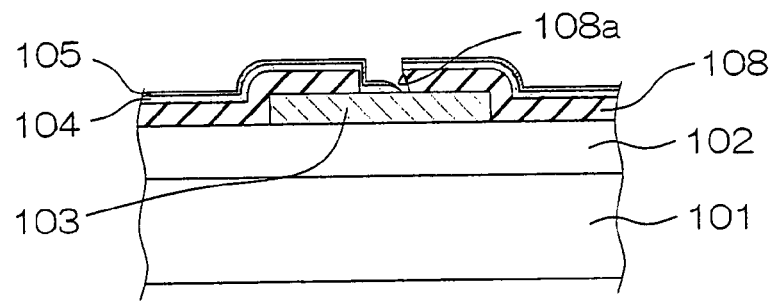
FIG. 6(a) to FIG. 6(c) are cross-sectional views for explaining a manufacturing method for the semiconductor device shown in FIG. 5.
Figure 6B:
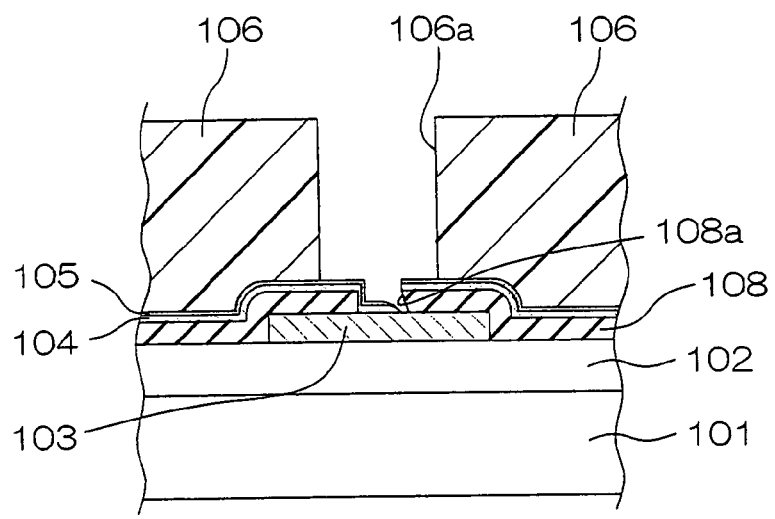
Figure 6C:
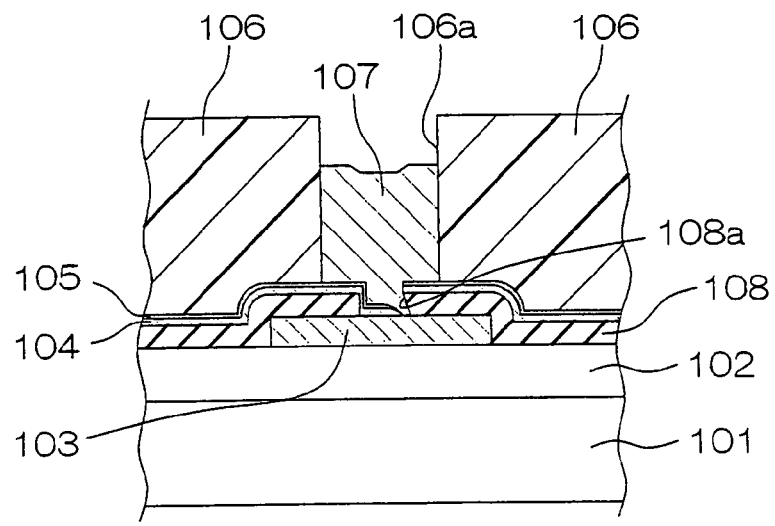

According to the above described manufacturing method for semiconductor device 10, it is not necessary to remove diffusion prevention plug 4 after the formation of protrusion electrode 7, because diffusion prevention plug 4 is formed only in the vicinity of the exposed portion of predetermined electrode pad 3, unlike barrier metal layer 104 that is utilized in the conventional manufacturing method (see FIG. 5 and FIG. 6(*a*) to FIG. 6(*c*)).

In addition, protrusion electrode 7 and seed layer 5 are formed in a region that substantially completely includes the region where diffusion prevention plug 4 has been formed, as seen in the plan view where wafer W is viewed vertically from the top, and substantially completely cover diffusion prevention plug 4. Therefore, even at the time when wet etching is carried out on the portion of seed layer 5 which is not covered by protrusion electrode 7, and thus is exposed, on passivation film 8, diffusion prevention plug 4 is not exposed, and thus maintains its initial form. That is, no problems occur, unlike in the conventional manufacturing method, wherein barrier metal layer 104 is over-etched at the time of the removal of barrier metal layer 104, reducing the strength of the connection between protrusion electrode 107 and electrode pad 103, or reducing reliability as a result of the exposure of electrode pad 103 (see FIG. 5).

In particular, in the case where the intervals of adjacent protrusion electrodes 7 are designed to be small, protrusion electrodes 7 must be miniaturized, and the size (particularly the width) of diffusion prevention plugs 4 must be reduced, in order to avoid contact between adjacent protrusion electrodes 7. However, it is not necessary to remove a portion of diffusion prevention plug 4 after the formation thereof, and therefore, the strength of the connection between protrusion electrode 7 and electrode pad 3 via diffusion prevention plug 4 is not reduced due to over-etching, and reliability is not reduced due to the exposure of electrode pad 3. In other words, it is not necessary to design a large width of protrusion electrode 107(7) taking the margin of over-etching into consideration, unlike in the conventional semiconductor device, in order to sufficiently enhance the strength of the connection between electrode pad 3 and protrusion electrode 7.

Therefore, even in the case where the intervals between adjacent protruding electrodes 7 are designed to be small, protrusion electrodes 7 can be miniaturized, thereby preventing these protrusion electrodes 7 from being easily connected to each other or from being electrically short-circuited. That is, according to this manufacturing method, it is possible to manufacture semiconductor device 10 where microscopic protrusion electrodes 7 are aligned at small intervals.

In addition, diffusion prevention plug 4 is formed by means of isotropic electroless plating, and therefore, diffusion prevention plug 4 completely covers electrode pad 3 even in the case where opening 8a is in reverse taper form, unlike in the conventional manufacturing method where electrode pad 103 is exposed from barrier metal layer 104 (see FIG. 5).

FIG. 3 is a cross-sectional view illustrating a semiconductor device that is obtained in accordance with a manufacturing method according to the second embodiment of the present invention. In FIG. 3, the same reference symbols are attached to the parts respectively corresponding to the parts shown in FIG. 1 of which the descriptions are omitted.

Though this semiconductor device 15 has a structure similar to that of semiconductor device 10 of FIG. 1, a seed layer 18 and a protrusion electrode 17 having widths smaller than that of diffusion prevention plug 4 are formed on diffusion prevention plug 4. The side surface of protrusion electrode 17 and the end surfaces of seed layer 18 are approximately on the same plane. As a result of this, diffusion prevention plug 4 is not completely covered by seed layer 18 or protrusion electrode 17, and thus is exposed.

This semiconductor device 15 makes possible a flip chip connection to electrode pad or the like formed on a wiring substrate via protrusion electrodes 17. The width of protrusion electrode 17 can be made smaller than the width of, for example, an electrode pad on a wiring substrate to which semiconductor device 15 is connected. In this case, the tolerance for a positional shift between protrusion electrode 17 and the electrode pad on the wiring substrate when they are joined to each other can be increased. That is, even in the case where the end surface of protrusion electrode 17 is slightly shifted from the center portion of the electrode pad on the wiring substrate, the entirety of the end surface of protrusion electrode 17 can be connected to this electrode pad.

Figure 4A:
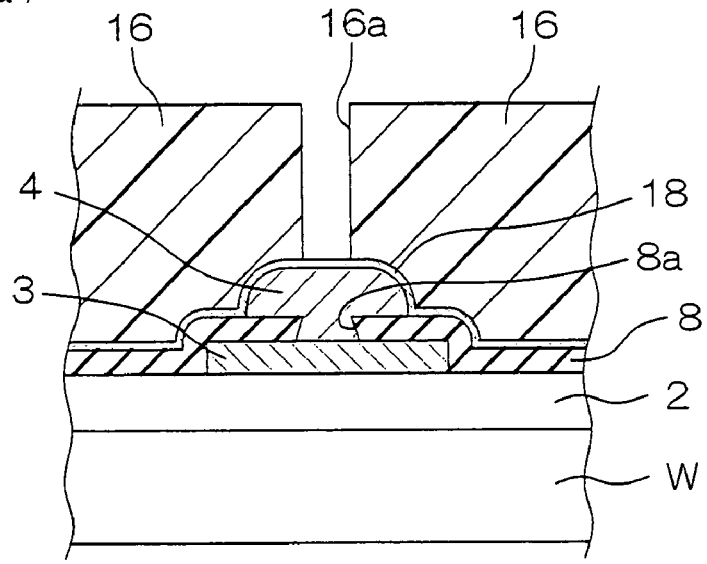
FIG. 4(a) to FIG. 4(c) are cross-sectional views for explaining a manufacturing method for the semiconductor device shown in FIG. 3.
Figure 4B:
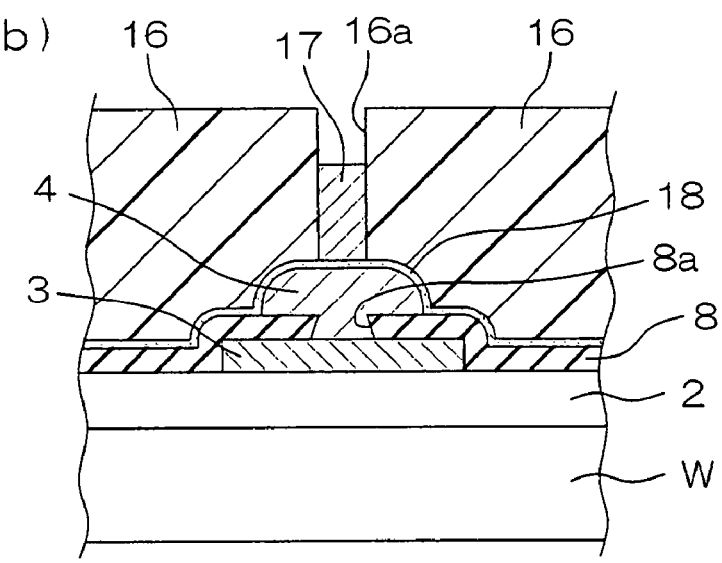
Figure 4C:
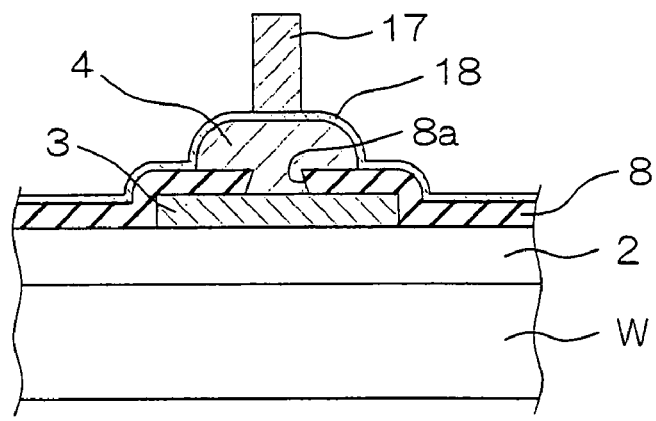

FIG. 4(a) to FIG. 4(c) are cross-sectional views for explaining a manufacturing method for semiconductor device 15 shown in FIG. 3. The same symbols as in the case of FIG. 2(a) to FIG. 2(f) are attached to the parts in FIG. 4(a) to FIG. 4(c) that correspond to the constituent in FIG. 2(a) to FIG. 2(f), of which the descriptions are omitted.

Figure 2C:
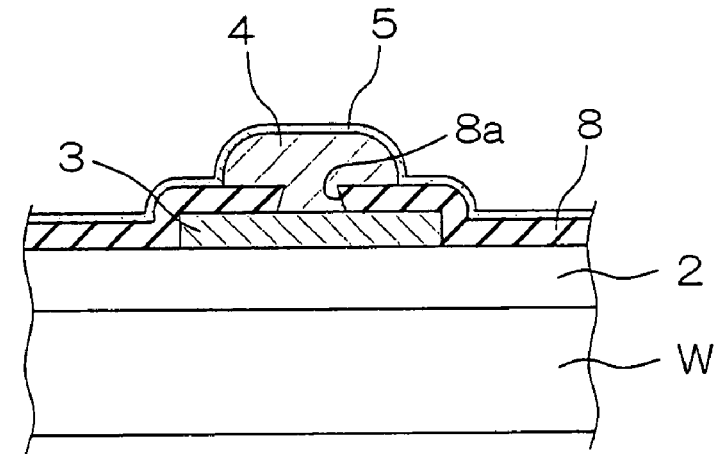
Figure 2D:
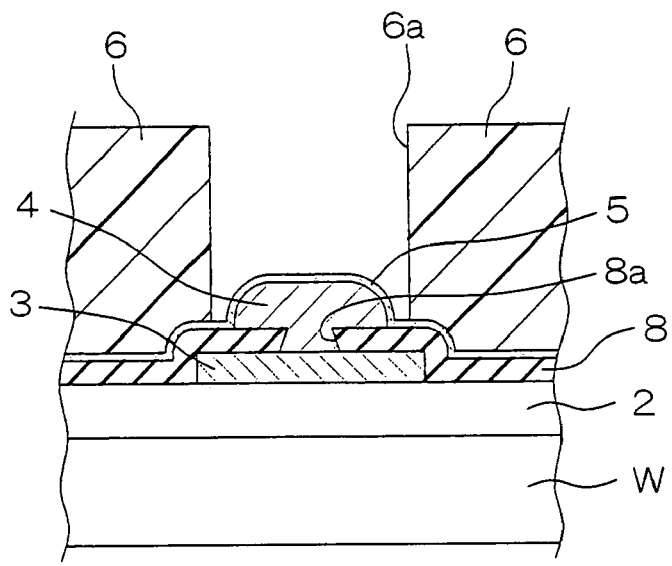

In accordance with the manufacturing method according to the first embodiment, a passivation film 8 and a diffusion prevention plug 4 are formed on the surface of a wafer W on which an active layer 2 has been formed, and furthermore, a resist film (photoresist) 16 is formed on the entirety of the surface of wafer W on which a seed layer 18 having electrical conductivity has been formed, according to a method such as sputtering (see FIG. 2(c)).

Then, the portion of resist film 16 above diffusion prevention plug 4 is removed by means of photolithography, so that an opening 16a is formed in resist film 16. The width of opening 16a in resist film 16 is made to be smaller than the width of diffusion prevention plug 4. In addition, only the portion of seed layer 18 on the end surface of diffusion prevention plug 4 which is substantially flat is exposed within opening 16a in resist film 16 (see FIG. 4(a)).

After that, protrusion electrode 17 made of, for example, gold (Au), is formed by means of electrolysis plating within opening 16a in resist film 16. At this time, a current flows between the plating solution and seed layer 18 that has been exposed within opening 16a in resist film 16, and thereby, metal atoms are deposited on seed layer 18 so that protrusion electrode 17 grows. That is, opening 16a in resist film 16 is filled with protrusion electrode 17 from seed layer 18 side.

At this time, the form of the top surface (end surface) of protrusion electrode 17 becomes almost flat, reflecting the form of the top surface of diffusion prevention plug 4. The formation of protrusion electrode 17 is completed before opening 16a in resist film 16 is completely filled. As a result of this, as shown in FIG. 4(b), the state is reached where protrusion electrode 17 exists only within opening 16a in resist film 16.

Next, resist film 16 is removed so as to reach the state where protrusion electrode 17 protrudes from seed layer 18 (see FIG. 4(c)).

Subsequently, the portion of seed layer 18 which is not covered by protrusion electrode 17, and thus is exposed, on diffusion prevention plug 4 is removed by means of wet etching, so as to reach the state where seed layer 18 and protrusion electrode 17 protrude from diffusion prevention plug 4. This process can be carried out by etching seed layer 18 using an etchant of which the etching rate of seed layer 18 (made of, for example, gold) is greater (corrosiveness is stronger) than that of diffusion prevention plug 4 (made of, for example, nickel). In this case, seed layer 18 on diffusion prevention plug 4 can be removed, while diffusion prevention plug 4 can mostly be prevented from being removed, even in the case where diffusion prevention plug 4 is exposed to the etchant.

In addition, in the case where seed layer 18 and protrusion electrode 17 are made of the same metal material, seed layer 18 between diffusion prevention plug 4 and protrusion electrode 17 can be prevented from being over-etched.

The step of removing seed layer 18 may be carried out by means of dry type anisotropic etching.

After that, wafer W is cut into pieces of a semiconductor substrate 9, thus obtaining semiconductor device 15 shown in FIG. 3.

In accordance with the above described manufacturing method for semiconductor device 15, the width of opening 16a in resist film 16 is made to be small, so that only the portion of seed layer 18 on the flat surface of diffusion prevention plug 4 is exposed within opening 16a in resist film 16, and thereby, almost the entirety of the end surface of protrusion electrode 17 can be made to be flat.

In accordance with the above described manufacturing method for semiconductor device 10 and 15, the widths of seed layer 5 or 18 and protrusion electrode 7 or 17 are determined by the width of opening 6a or 16a in the resist film, and are not limited by the size (width or the like) of diffusion prevention plug 4. It is possible to make the width of protrusion electrode 17 small, as long as it is possible to form opening 16a in resist film 16 by means of photolithography so that opening 16a in resist film 16 is of a certain precise size, and in addition, as long as the formation of protrusion electrode 17 by means of electrolysis plating in opening 16a in resist film 16 is possible.

Though the embodiments of this invention are described above, other embodiments of this invention are possible. For example, a layer made of a metal of a low melt point (for example, tin (Sn)) may be formed on the end surface of protrusion electrode 7 or 17. The protrusion electrode of such a semiconductor device can be joined to an electrode pad or the like formed on a wiring substrate, by heating the semiconductor device at a temperature no lower than the melt point (solidus temperature) of the metal of a low melt point, so that the layer made of this metal of a low melt point is melted at the time when the semiconductor device is joined to the electrode pad formed on the wiring substrate.

Figure 2E:
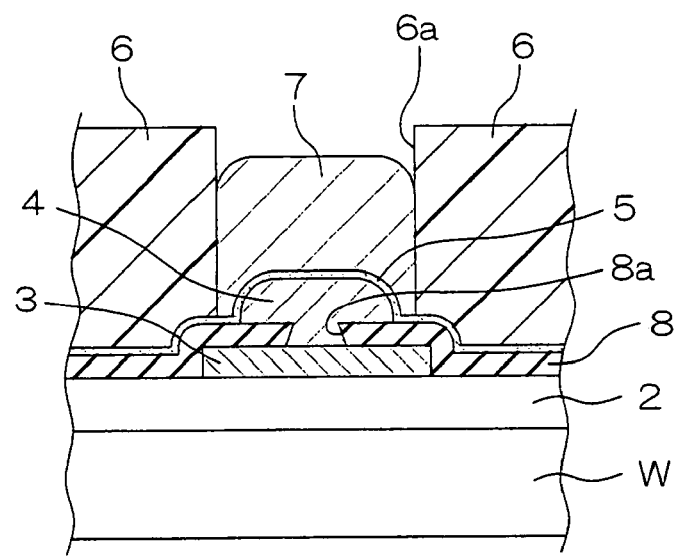
Figure 2F:
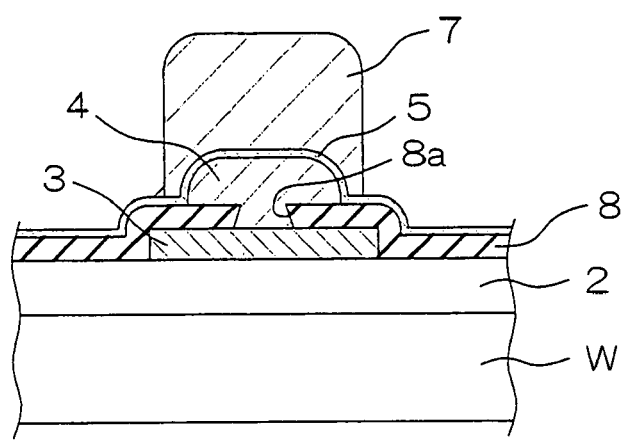

A semiconductor device having such a protrusion electrode 7 or 17 can be obtained by forming a layer of a metal of a low melt point on protrusion electrode 7 or 17 and on resist film 6 or 16, by means of, for example, a chemical deposition method or sputtering method, after the formation (see FIG. 2(e) and FIG. 4(b)) of protrusion electrode 7 or 17 by means of electrolysis plating, and before the removal (see FIG. 2(f) and FIG. 4(c)) of resist film 6 or 16, and after that, by removing the layer made of the metal of a low melt point on resist film 6 or 16 together with resist film 6 or 16.

The layer of a metal of a low melt point may be formed by means of electrolysis plating. Concretely, first, protrusion electrode 7 or 17 is formed (see FIG. 2(e) and FIG. 4(b)) by means of electrolysis plating or the like, and after that, a layer of a metal of a low melt point is formed on protrusion electrode 7 or 17 by means of electrolysis plating, before resist film 6 or 16 is removed (see FIG. 2(f) and FIG. 4(c)). At this time, a current flows between the plating solution and seed layer 5 or 18 through the exposed portion of protrusion electrode 7 or 17, and thereby, atoms of the metal of a low melt point are deposited on protrusion electrode 7 or 17, so that the layer of the metal of a low melt point grows. The formation of the layer of the metal of a low melt point is completed before opening 6a or 16a in resist film 6 or 16 is completely filled. After that, resist film 6 or 16 is removed, and thereby, protrusion electrode 7 or 17, where the layer of the metal of a low melt point is formed on the end surface, is obtained.

Though the embodiments of the present invention are described in detail, they merely are concrete examples which are used to clarify the technical contents of the present invention, and therefore, the present invention should not be interpreted as being limited to these examples, but rather, the spirit and the scope of the present invention are limited only by the attached claims.

This application corresponds to Japanese Patent Application No. 2003-345923 that was filed with the Japanese Patent Office on Oct. 3, 2003, and the entirety of the disclosure of this application is incorporated herein by reference.

What is claimed is:

1. A manufacturing method for a semiconductor device including a protrusion electrode for flip chip connection, the method comprising the steps of:

forming a passivation film that covers a surface of a semiconductor substrate on which electrodes made of metal have been formed, in which an opening is formed so as to expose a predetermined electrode from among the electrodes;

forming a diffusion prevention plug made of a first metal in the vicinity of the opening in the passivation film;

supplying a second metal material to the surface of the semiconductor substrate on which the diffusion prevention plug has been formed, so as to form a seed layer made of the second metal;

forming a resist film that covers the seed layer and in which an opening is formed so as to expose a predetermined region of the seed layer on the diffusion prevention plug;

supplying a third metal material into the opening in the resist film so as to form the protrusion electrode made of the third metal;

removing the resist film after the step of forming the protrusion electrode; and removing the seed layer after the step of forming the protrusion electrode, wherein the first metal of the diffusion prevention plug prevents an occurrence of diffusion between the metal of the electrodes and the third metal, wherein, in the step of forming the diffusion prevention plug, a forming region of the diffusion prevention plug is set so that the seed layer is in contact with the passivation film in the step of forming the seed layer, and wherein, in the step of forming the diffusion prevention plug, the diffusion prevention plug is formed so that a height of the diffusion prevention plug is higher throughout a portion corresponding to the opening in the passivation film than an upper surface of a region of the seed layer that is formed in the step of forming the seed layer, the region of the seed layer being in contact with the passivation film.

2. A manufacturing method for a semiconductor device according to claim 1, wherein the step of removing the seed layer includes an etching step of removing the seed layer by means of etching, and the first metal has an etching rate lower than that of the seed layer for an etching medium used in the etching step.

3. A manufacturing method for a semiconductor device according to claim 1, wherein the step of forming the diffusion prevention plug includes a step of supplying the first metal onto the predetermined electrode on the semiconductor substrate by an electroless plating method, so as to form the diffusion prevention plug made of the first metal on the predetermined electrode.

4. A manufacturing method for a semiconductor device according to claim 1, wherein the seed layer and the protrusion electrode are made of a same metal.

5. A manufacturing method for a semiconductor device according to claim 1, wherein the resist film is made of a material having photosensitivity, and the step of forming the resist film includes a step of forming the opening in the resist film by developing after exposing the resist film via a mask having a predetermined pattern.

6. A manufacturing method for a semiconductor device according to claim 1, wherein the step of forming the protrusion electrode includes a step of supplying the third metal material to the predetermined region of the seed layer by an electrolysis plating method.

7. A manufacturing method for a semiconductor device according to claim 1, wherein the step of removing the seed layer includes a step of removing the portion of the seed layer that is exposed from the protrusion electrode, by a dry type anisotropic etching method.

8. A manufacturing method for a semiconductor device according to claim 1, wherein the step of removing the seed layer includes a step of removing the portion of the seed layer that is exposed from the protrusion electrode, by a wet etching method.

9. A manufacturing method for a semiconductor device according to claim 1, wherein a width of the opening in the resist film is greater than a width of the diffusion prevention plug.

* * * * *